United States Patent
Yamada et al.

(10) Patent No.: US 6,297,131 B1
(45) Date of Patent: Oct. 2, 2001

(54) SEMICONDUCTOR DEVICE MANUFACTURING METHOD FOR GRINDING AND DICING A WAFER FROM A BACK SIDE OF THE WAFER

(75) Inventors: Yutaka Yamada, Kawasaki; Takanori Muramoto, Kasugai, both of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/357,657

(22) Filed: Jul. 20, 1999

(30) Foreign Application Priority Data

Apr. 22, 1999 (JP) .................................. 11-115402

(51) Int. Cl.⁷ .................................. H01L 21/46
(52) U.S. Cl. ............................ 438/464; 438/118
(58) Field of Search .................. 438/48, 57, 64, 438/118, 460, 690, 68, 459, 464

(56) References Cited

U.S. PATENT DOCUMENTS 5,960,260 * 9/1999 Umehara et al. ............... 438/118

6,048,749 * 4/2000 Yamada ............................ 438/64

FOREIGN PATENT DOCUMENTS 7-22358   1/1995  (JP) .

* cited by examiner

*Primary Examiner*—David Nelms
*Assistant Examiner*—David Vu
(74) *Attorney, Agent, or Firm*—Armstrong, Westerman, Hattori, McLeland & Naughton, LLP

(57) ABSTRACT

A yield rate and a throughput of a semiconductor device can be increased when a large-diameter wafer having a reduced thickness is used. The semiconductor device is produced by using a wafer having a front surface on which circuits are formed and a back surface opposite to the front surface. A protective tape is applied to the front surface of the wafer. The wafer is mounted to a dicing tape via the protective tape, the dicing tape being spread on a wafer frame having a size larger than a diameter of the wafer. The back surface of the wafer is ground while the wafer is mounted on the dicing tape. The wafer is diced, after the wafer is ground, while the wafer is mounted on the dicing tape so as to form the semiconductor device by full-dicing.

7 Claims, 9 Drawing Sheets

(SUCTION)

( HIGH-INTENSITY UV LIGHT )

SEMICONDUCTOR DEVICE MANUFACTURING METHOD FOR GRINDING AND DICING A WAFER FROM A BACK SIDE OF THE WAFER

BACKGROUND OF THE INVENTION

1. Field of the Invention

The present invention generally relates to a method for manufacturing a semiconductor device and, more particularly, to a method for grinding and dicing a large-diameter wafer to produce a semiconductor device having a reduced thickness.

In a manufacturing process of a semiconductor device, a wafer on which circuit patterns are formed is subjected to a grinding process so as to reduce a thickness of the wafer. The grinding is applied to a surface (back surface) on which no circuit pattern is formed.

In recent years, large-diameter wafers have been used to improve productivity of semiconductor devices. Additionally, since semiconductor devices having a small thickness have been required for use in an IC card, it is required to reduce a thickness of a wafer. Further, use of a wafer having bumps, which bumps are formed before the wafer is subjected to dicing, has been increased. However, an increase in a diameter of the wafer, reduction in a thickness of the wafer and the wafer having bumps may increase a possibility of wafer cracking during a manufacturing process.

For example, when a large-diameter wafer is ground, a thickness of the wafer is limited to about 200 $\mu$m. That is, if the wafer is ground to a thickness of less than 200 $\mu$m, the wafer may frequently crack during the grinding process and a handling process.

Additionally, in the wafer having bumps, a possibility of wafer cracking during the grinding process is increased since the bumps act as protrusions.

Accordingly, it is desired to establish a technique for grinding and dicing a large-diameter wafer at a high throughput without damaging the wafer.

2. Description of the Related Art

A description will now be given, with reference to FIGS. 1 to 6, of a conventional manufacturing method of a semiconductor device. The manufacturing method of a semiconductor device includes a grinding process and a dicing process. In the grinding process, grinding (referred to as back grinding) is applied to a back surface of a wafer so that a thickness of the wafer is reduced to a predetermined thickness. In the dicing process, dicing is applied to the wafer so that the wafer is divided into a plurality of individual semiconductor chips.

FIG. 1 is a flowchart of a conventional manufacturing method of a semiconductor device in which method a dicing process and a grinding process are performed. The conventional method shown in FIG. 1 comprises the steps of: applying a protective tape to a wafer having a front surface on which circuits are formed (step S10); grinding a back surface of the wafer (step S20); applying a dicing tape to the wafer after turning over the wafer (step S14); and dicing the wafer from the side of the front surface (step S16).

FIG. 2 is an illustration for explaining the protective tape applying process (step S10) shown in FIG. 1. FIG. 3 is an illustration for explaining the grinding process (step S12) shown in FIG. 1. FIG. 4 is an illustration for explaining the dicing tape applying process (step S14) shown in FIG. 1. FIG. 5 is an illustration for explaining the dicing process (step S16) shown in FIG. 1.

Semiconductor circuits are previously formed on a front surface of a wafer 10 to be ground. First, as shown in FIG. 2, a protective tape 12 is applied to the front surface of the wafer 10 so as to protect the semiconductor circuits formed on the front surface of the wafer 10. Then, the wafer 10 is fixed by suction on a vacuum chuck table via the protective tape 12. The protective tape 12 is formed of a resin, and an ultraviolet cure pressure-sensitive adhesive is applied to a surface thereof. The wafer 10 is ground in a state in which the wafer 10 is fixed on the vacuum chuck table via the protective tape 12.

In the grinding process, the back surface of the wafer 10 is ground by using a grinding tool 18 as shown in FIG. 3 so as to reduce a thickness of the wafer 10 to a predetermined thickness. Specifically, the grinding is performed by moving the rotating grinding tool 18 in directions indicated by arrows X1 and X2 while supplying a grinding liquid. Thereby, the wafer 10 having the predetermined thickness is formed.

After the grinding process is completed, the wafer 10 is removed from the protective tape 12. Then, the wafer 10 is applied to a dicing tape 20 which is spread on a wafer frame 14 so that the front surface of the wafer 10 on which front surface the circuits are formed faces upwardly as shown in FIG. 4. The dicing tape 20 is formed of a resin, and the pressure-sensitive adhesive is applied to a surface of the dicing tape 20. The wafer 10 is diced in a state in which the wafer 10 is secured on the dicing tape 20 by the pressure-sensitive adhesive.

In the dicing process, the wafer 10 is diced by using a dicing saw 22 as shown in FIG. 5. The dicing is performed while monitoring an image of a scribe line formed on the front surface of the wafer 10. Thereby, the wafer 10 is divided into a plurality of semiconductor chips 11.

According to the above-mentioned conventional method, a pressing force is applied to a part of the wafer 10 by the grinding tool 18 since the grinding process is performed prior to the dicing process. When the thickness of the wafer 10 is reduced to less than 200 $\mu$m by grinding, the strength of the wafer 10 is reduced. Accordingly, the wafer may crack during the grinding process. Particularly, when the thickness of the wafer 10 is reduced to 50 $\mu$m by grinding, there is a problem in that wafer cracks may frequently occur. Additionally, when the wafer 10 is provided with bumps, the bumps may act as protrusions and the grinding is performed in a state in which the wafer 10 is placed on the protrusions. Thus, a possibility of occurrence of cracking in the wafer 10 is further increased.

Additionally, in the above-mentioned conventional method, after the wafer 10 is ground to the predetermined thickness, the protective tape 12 is removed and the wafer 10 is turned over. That is, the back surface of the wafer 10 faces upwardly when the grinding process is completed. Accordingly, in order to perform the dicing from the side of the front surface, the wafer 10 is applied on the dicing tape 20 with the front surface of the wafer 10 facing upwardly.

However, since the thickness of the wafer 10 is reduced by grinding, the wafer 10 warps as shown in FIG. 6 after the protective tape 12 is removed. A degree of warpage of the wafer 10 can be represented by a maximum distance (indicated by an arrow H in FIG. 6) between the dicing tape 20 and the wafer 10. If a 6-inch wafer is ground to a thickness of 200 $\mu$m, a warpage of about 2 cm (H=2 cm) is generated. Additionally, if an 8-inch wafer is ground to a thickness of 200 $\mu$m, a warpage of about 3 cm (H=3 cm) is generated.

If a warpage is generated in the wafer 10 as mentioned above, there is a problem in that the wafer 10 cannot be properly handled. In a worst case, the wafer may crack during the handling.

SUMMARY OF THE INVENTION

It is a general object of the present invention to provide an improved and useful method for manufacturing a semiconductor device in which method the above-mentioned problems are eliminated.

A more specific object of the present invention is to provide a method for manufacturing a semiconductor device which method can increase a yield rate and a throughput of the semiconductor device when a large-diameter wafer having a reduced thickness is used to produce the semiconductor device.

In order to achieve the above-mentioned objects, there is provided according to the present invention a method for manufacturing a semiconductor device by using a wafer having a front surface on which circuits are formed and a back surface opposite to the front surface, the method comprising the steps of:

applying a protective tape to the front surface of the wafer;

mounting the wafer to a dicing tape via the protective tape, the dicing tape being spread on a wafer frame having a size larger than a diameter of the wafer;

grinding the back surface of the wafer while the wafer is mounted on the dicing tape; and dicing the wafer, after the step of grinding is completed, while the wafer is mounted on the dicing tape.

According to the present invention, the protective tape is applied to the front surface of the wafer before the wafer is subjected to the grinding process. The protective tape is provided to protect the circuits formed on the front surface of the wafer during the grinding process. Additionally, the protective tape acts as a cushion member which absorbs a pressing force exerted by a grinding tool during the grinding process. That is, in the frame mounting process, the wafer is mounted on the dicing tape via the protective tape. In the subsequent grinding process, when the grinding tool is pressed against the back surface of the wafer, the protective tape absorbs the pressing force of the grinding tool together with the dicing tape. Accordingly, the local pressing force exerted on the wafer during the grinding process is absorbed and relaxed by both the protective tape and the dicing tape, and, thereby, the wafer is prevented from being damaged or cracked during the grinding process.

After the grinding process is completed, the dicing process is performed while the wafer is continuously mounted on the dicing tape. That is, the dicing is performed from the back surface of the wafer. Accordingly, the dicing is performed without removing the dicing tape and the protective tape from the wafer which has been ground to have a reduced thickness. Thus, there is no damage or crack due to warpage of the wafer having the reduced thickness.

Thus, according to the present invention, the wafer is prevented from being damaged or cracked during the grinding process and the handling process between the grinding process and the dicing process. Thus, the semiconductor device can be produced at a high-yield rate and a high throughput.

Additionally, in the present invention, the step of dicing may include the steps of:

projecting an infrared beam onto the wafer from a side of the back surface of the wafer so as to detect reflection of the infrared beam; and recognizing a scribe line based on the reflection of the infrared beam so that the dicing is performed by referring to the recognized scribe line.

Generally, in the dicing process, the dicing is performed by referring to the scribe line formed on the front surface of the wafer. The scribe line is formed together with the circuit patterns formed on the front surface of the wafer. However, since the grinding is applied to the back surface of the wafer, the wafer must be turned over between the grinding process and the dicing process so as to directly observe and recognize the scribe line.

Generally, a plurality of marks made of aluminum are arranged on the scribe line. The scribe line can be recognized by referring to the positions of the marks. Since the infrared beam transmits through the wafer itself but is reflected by the aluminum marks, the positions of the aluminum marks can be recognized by detecting the reflected infrared beam on the back side of the wafer. Accordingly, there is no need to turn over the wafer between the grinding process and the dicing process. Thus, the wafer is prevented from being damaged or cracked during a handling process between the grinding process and the dicing process, and the manufacturing process of the semiconductor device is simplified.

Other objects, features and advantages of the present invention will become more apparent from the following detailed description when read in conjunction with the accompanying drawings.

DETAILED DESCRIPTION OF THE PREFERRED EMBODIMENT

A description will now be given, with reference to the drawings, of an embodiment according to the present invention.

Figure 1:
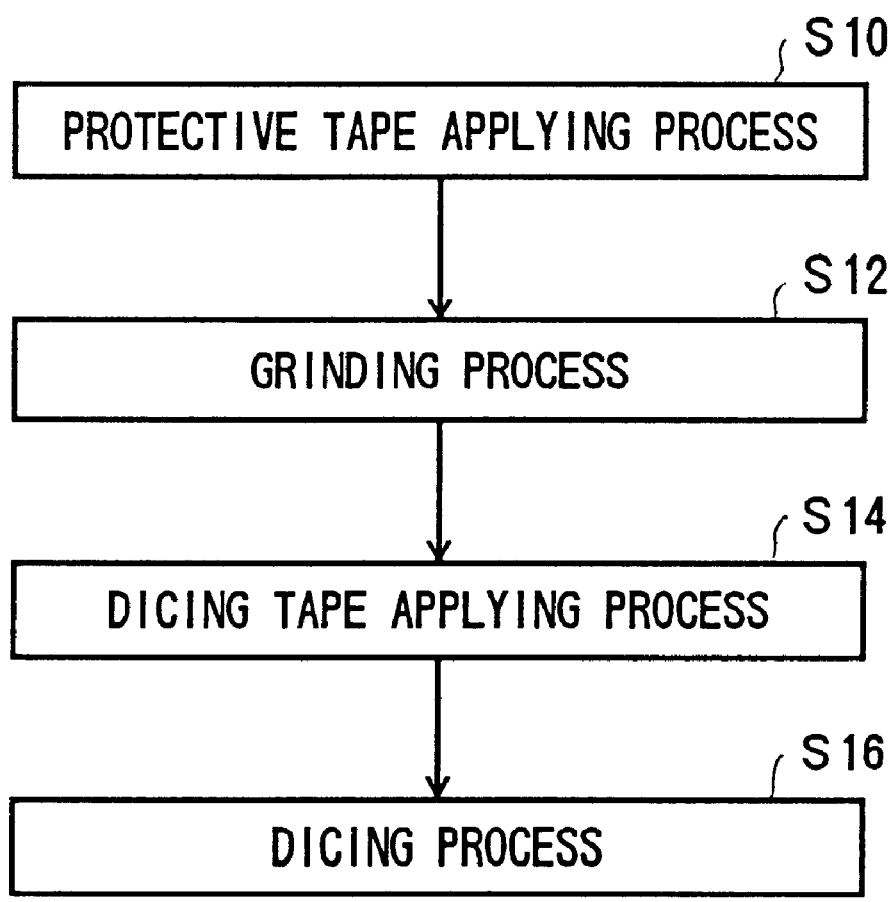
FIG. 1 is a flowchart of a conventional manufacturing method of a semiconductor device in which a dicing process and a grinding process are performed.
Figure 2:
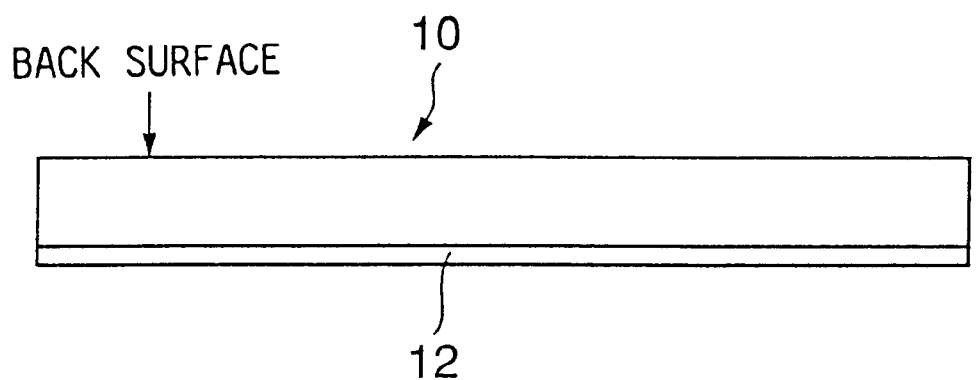
FIG. 2 is an illustration for explaining a protective tape applying process shown in FIG. 1.
Figure 3:
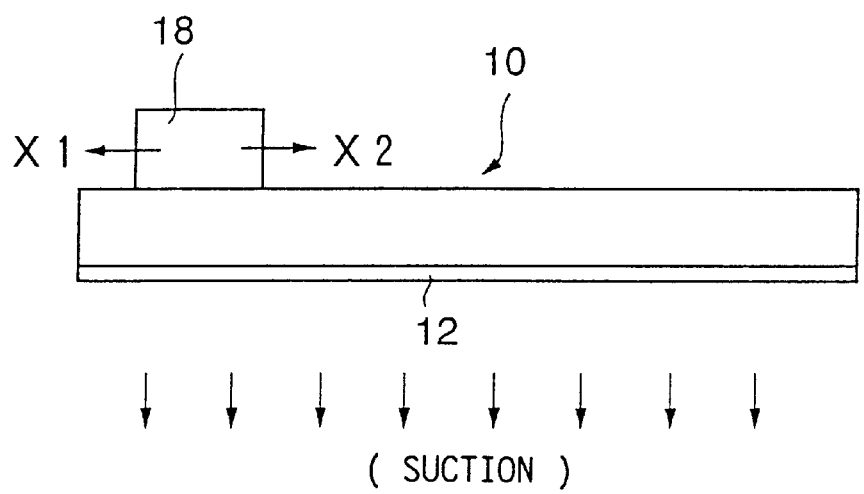
FIG. 3 is an illustration for explaining a grinding process shown in FIG. 1.
Figure 4:
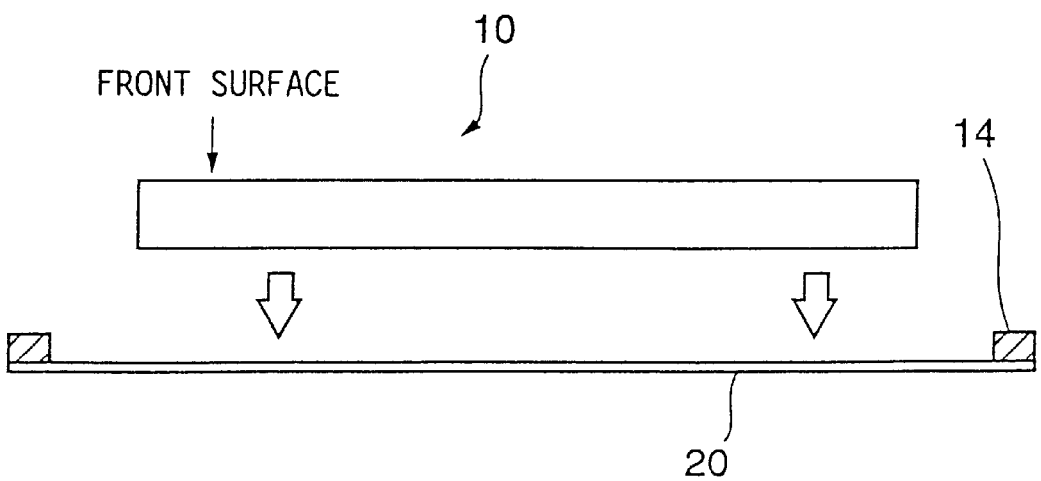
FIG. 4 is an illustration for explaining a dicing tape applying process shown in FIG. 1.
Figure 5:
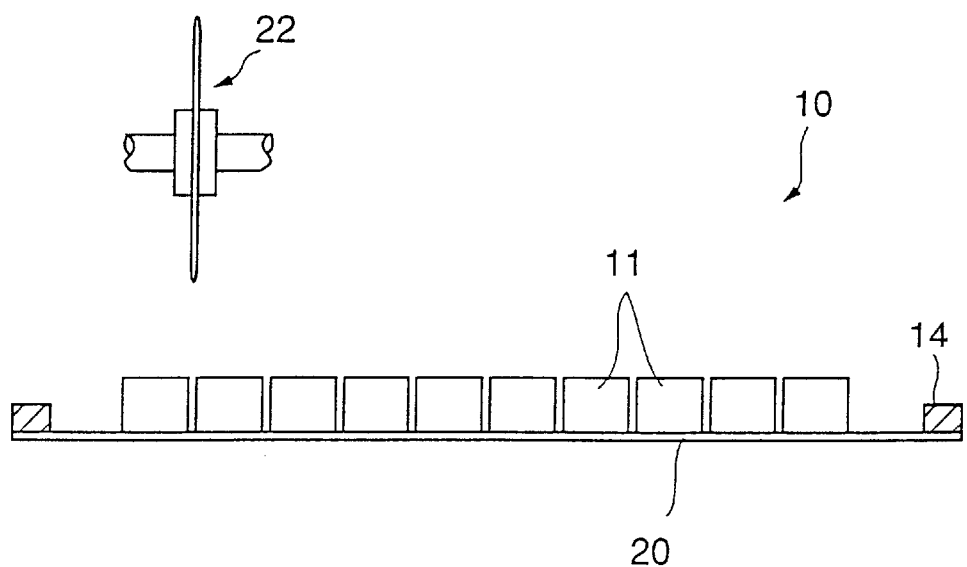
FIG. 5 is an illustration for explaining a dicing process shown in FIG. 1.
Figure 6:
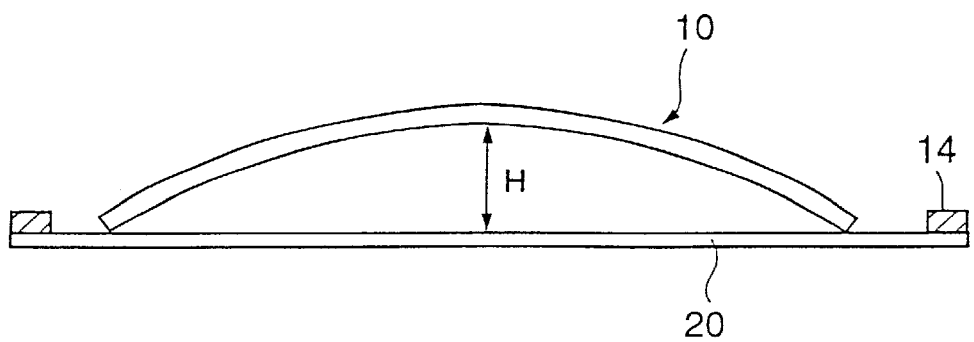
FIG. 6 is an illustration for explaining a problem in the conventional manufacturing method of a semiconductor device.
Figure 7:
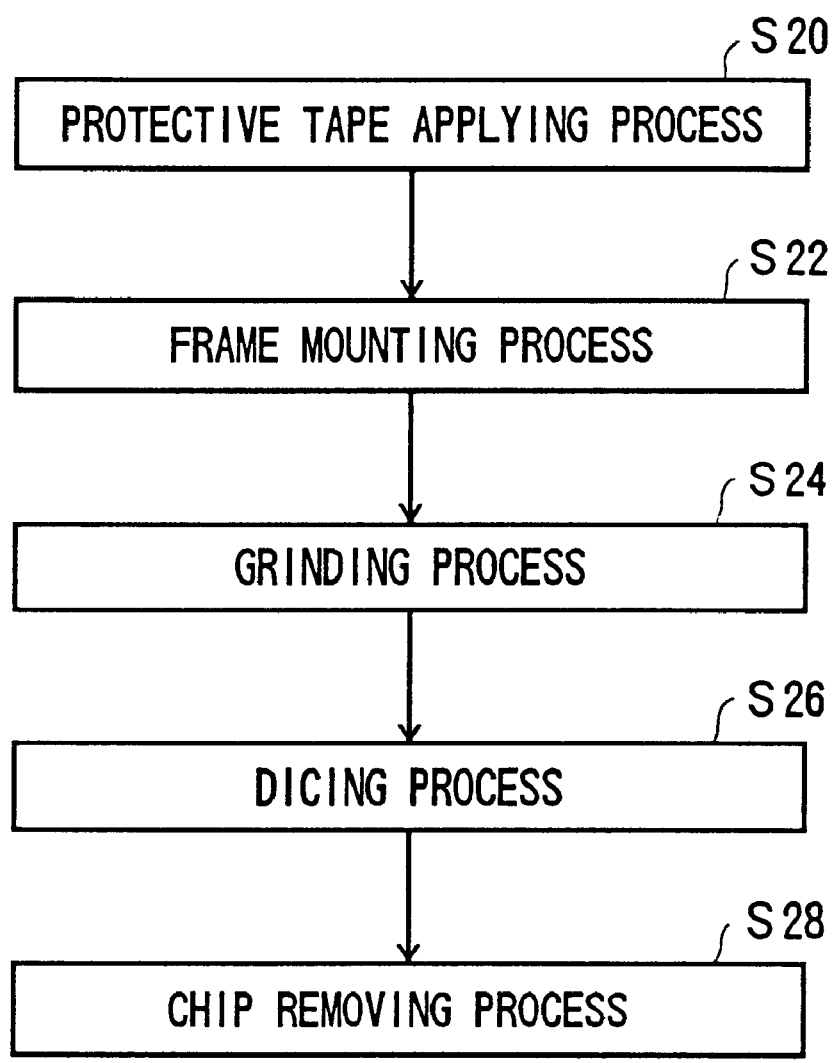
FIG. 7 is a flowchart of a manufacturing method of a semiconductor device according to an embodiment of the present invention.

FIG. 7 is a flowchart of a manufacturing method of a semiconductor device according to an embodiment of the present invention. It should be noted that the manufacturing method of a semiconductor device according to the present invention is particularly related to a dicing process for dicing a wafer and a grinding process for grinding the wafer, and other processes are similar to that of the conventional manufacturing method. Accordingly, in the present embodiment, descriptions will be given of the grinding process, the dicing process and processes related to the grinding process and the dicing process, and descriptions of other processes will be omitted.

In the manufacturing method according to the present embodiment, as shown in FIG. 7, a protective tape applying process (step S20), a frame mounting process (step S22), a grinding process (step S24), a dicing process (step S26) and a chip removing process (step S28) are sequentially performed in that order. A description will be given below of each of the above-mentioned processes.

Figure 8:
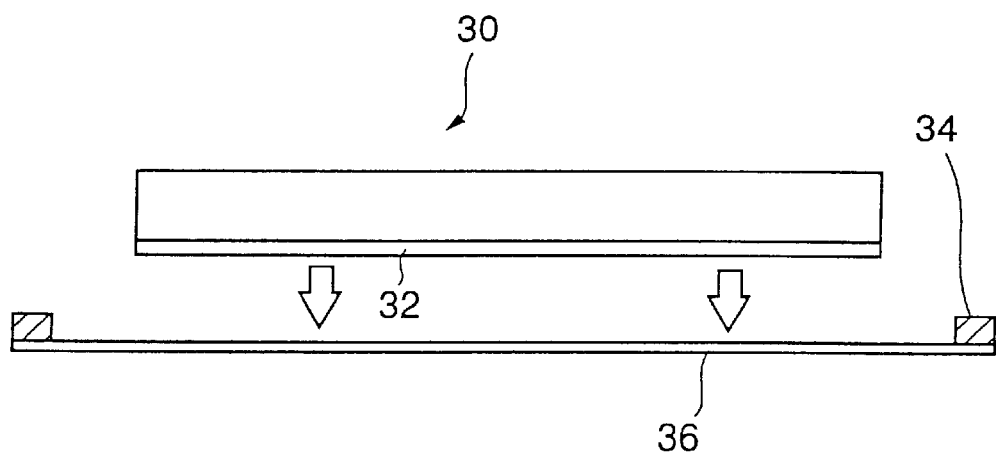
FIG. 8 is an illustration for explaining a protective tape applying process and a frame mounting process shown in FIG. 7.

FIG. 8 is an illustration for explaining the protective tape applying process (step S20) and the frame mounting process (step S22). Circuits for forming semiconductor devices are previously formed on a front surface of a wafer 30. The wafer 30 is subjected to the grinding process so as to reduce a thickness of the wafer 30 by grinding a back surface which is opposite to the front surface. The protective tape applying process (step S22) and the grinding process (step S24) are performed as preparatory processes of the grinding process (step S24). It should be noted that a material of the wafer 30 is not limited to a specific material, and various semiconductor substrate materials such as silicon or gallium arsenide can be used. Additionally, a substrate other than semiconductor materials such as ferrite, or a piezoelectric substrate material such as lithium-tantalate ($LiTaO_3$) may be used.

First, in the protective tape applying process (step S20), the protective tape 32 is applied to the front surface of the wafer 30 on which front surface the circuits are formed. Hererinafter, the front surface may be referred to as a circuit forming surface. The protective tape 32 is formed of a polyethylene tape. An ultraviolet-cure pressure-sensitive adhesive is previously applied to the protective tape 32, and the protective tape 32 sticks to the wafer 30 by the ultraviolet-cure pressure-sensitive adhesive. A thickness of the polyethylene tape is about 150 $\mu$m, and a thickness of the pressure-sensitive adhesive is about 30 $\mu$m to 40 $\mu$m.

Thereafter, in the frame mounting process (step S22), the wafer 30 having the protective tape 32 applied thereto is mounted to a dicing tape 36 which is spread on a wafer frame 34. The dicing tape 36 is previously spread on the wafer frame 34, and a pressure-sensitive adhesive is applied to a surface of the dicing tape 36 on which surface the wafer 30 is mounted. The dicing tape 36 is formed of a polyethylene tape. A thickness of the dicing tape 36 is about 70 $\mu$m, and a thickness of the pressure sensitive adhesive is about 20 $\mu$m. The wafer 30 is mounted on the dicing tape 36 via the protective tape 32 by the pressure-sensitive adhesive. That is, the protective tape 32 is applied to the wafer 30, and the protective tape 32 is mounted to the dicing tape 36. Thus, in this state, the circuit forming surface of the wafer 30 is protected by the protective tape 32, and the back surface of the wafer 30 faces upwardly. After the wafer 30 is mounted to the wafer frame 34 in the above-mentioned manner, the grinding process (step S24) is performed.

Figure 9:
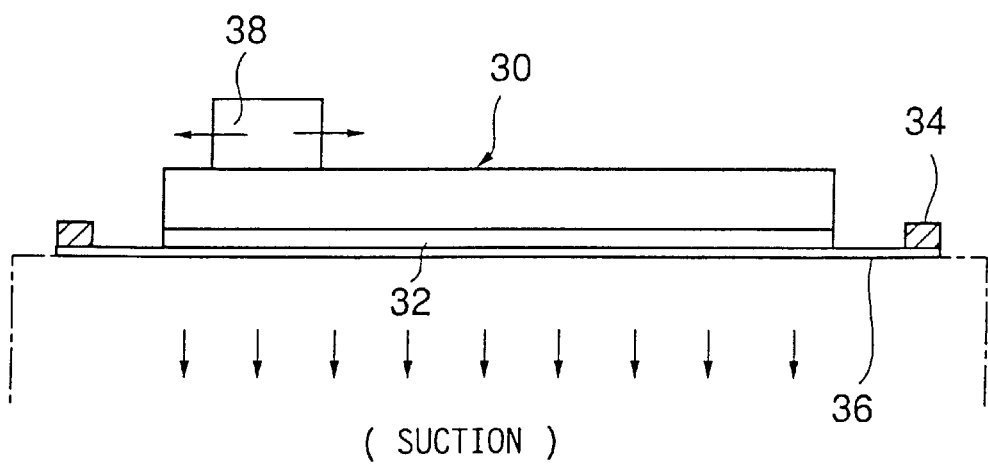
FIG. 9 is an illustration for explaining a grinding process shown in FIG. 7.

FIG. 9 is an illustration for explaining the grinding process. In the grinding process (step S24), the wafer frame 34 to which the wafer 30 is mounted is placed on a vacuum chuck table (indicated by single dashed chain lines in FIG. 9). The size of the vacuum chuck table is larger than the wafer frame 34, and, thus, the entire surface of the dicing tape 36 is supported by the vacuum chuck table and fixed on the vacuum chuck table by suction. Accordingly, the wafer 30 mounted on the dicing tape 36 is also secured on the vacuum chuck table. Since the entire surface of the wafer 30 is supported by the vacuum chuck table, the wafer 30 is supported in a stable state. Additionally, since the vacuum chuck table is larger than the wafer frame 34, the wafer frame 34 is also stably supported by the vacuum chuck table. Thus, the wafer 30 secured on the vacuum chuck table can be ground in a stable state.

The grinding is performed in the state in which the wafer 30 is placed on the vacuum chuck table. That is, a thickness of the wafer 30 is reduced by grinding the back surface of the wafer 30 by using a grinding tool 38 (for example, a diamond wheel). In the present embodiment, the wafer 30 is fixed on the vacuum chuck table via the protective tape 32 and the dicing tape 36. Additionally, a layer of the pressure-sensitive adhesive applied to each of the protective tape 32 and the dicing tape 36 is interposed between the wafer 30 and the vacuum chuck table. Accordingly, the protective tape 32, the dicing tape 36 and the pressure-sensitive adhesive layers act as a cushion member which disperses and relaxes a pressing force locally applied to the wafer 30 by the grinding tool 38. Thereby, the thickness of the wafer 30, which was conventionally limited to about 200 $\mu$m, can be reduced to as small as about 50 $\mu$m by grinding without being damaged by the local pressing force.

After the above-mentioned grinding process is completed, the dicing process (step S26) is performed. In the present embodiment, after the grinding process is performed on the wafer 30, the wafer 30 is conveyed to a dicing machine (not shown in the figure) while the wafer 30 is mounted on the wafer frame 34, and the wafer 30 is placed on a vacuum chuck table of the dicing machine. However, the wafer 30 may be conveyed to the dicing machine together with the vacuum chuck table while the wafer 30 is continuously fixed on the vacuum chuck table. In any case, the wafer 30 is subjected to the dicing process while the protective tape 32 and the dicing tape 36 are attached to the wafer 30.

Figure 10:
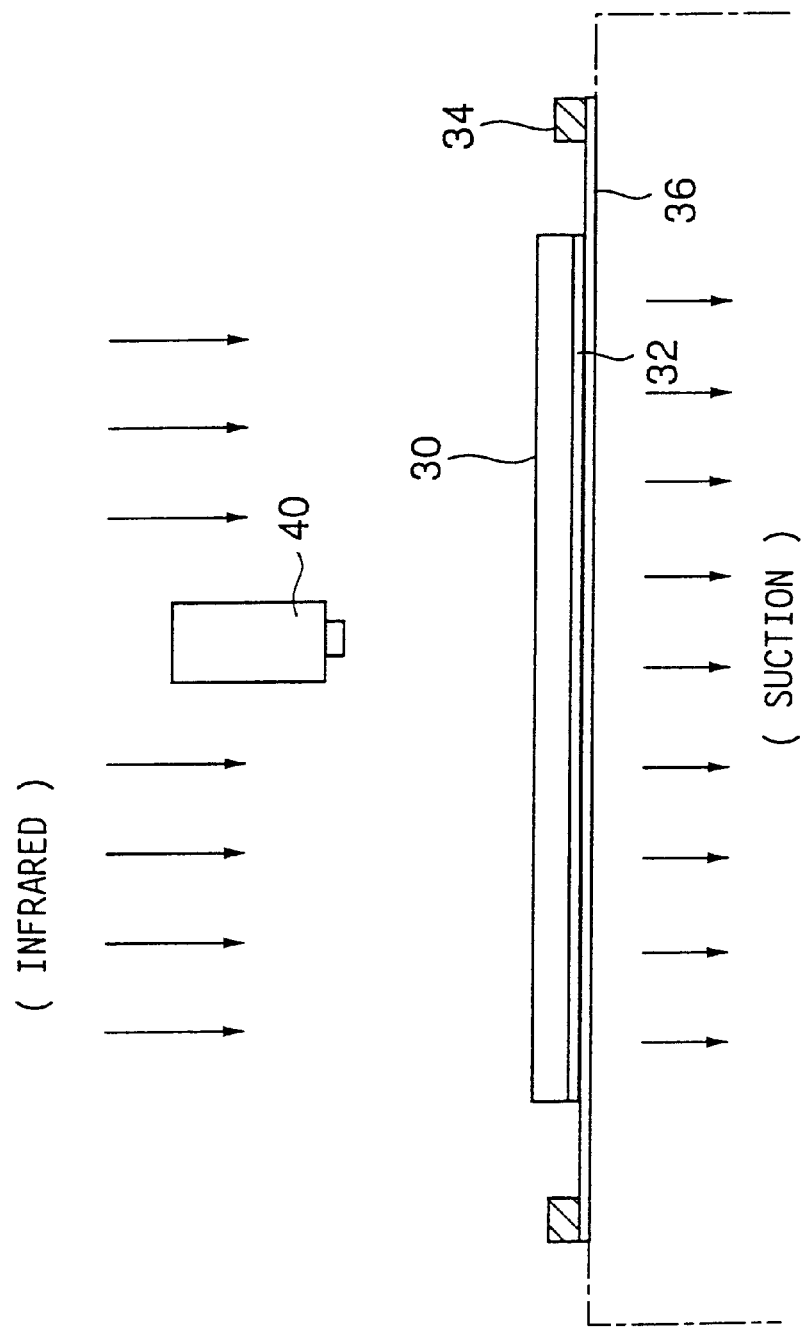
FIG. 10 is an illustration for explaining a dicing process shown in FIG. 7.
Figure 11:
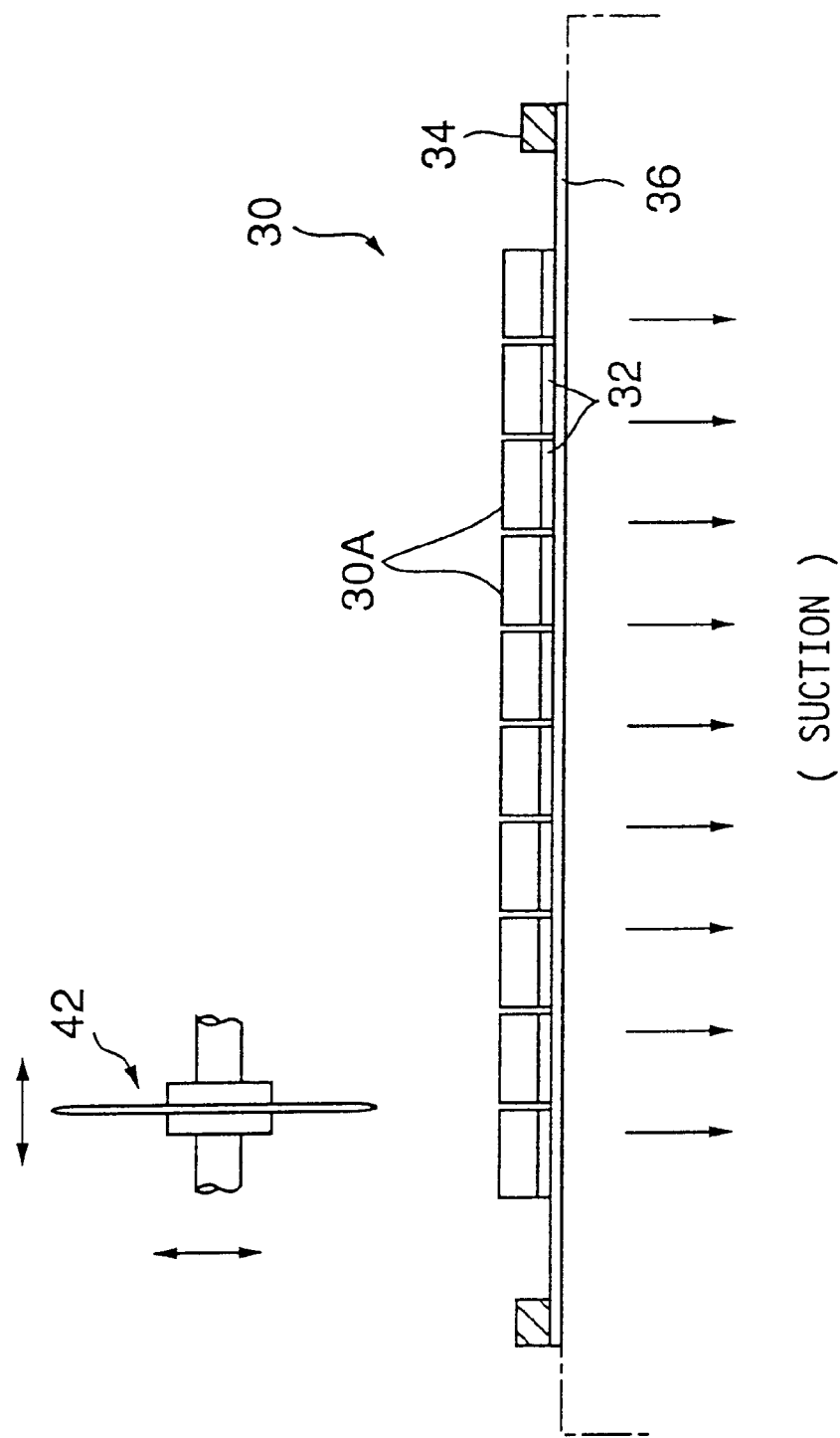
FIG. 11 is an illustration for explaining the dicing process shown in FIG. 7.

FIG. 10 and FIG. 11 are illustrations for explaining the dicing process. In the dicing process (step S26), a process for recognizing a position of a dicing line (scribe line) of the wafer 30 is performed by using an infrared camera provided to the dicing machine. Usually, in the dicing process, the dicing is performed by referring to the scribe line which is formed simultaneously with circuit patterns formed on the front surface (circuit forming surface) of the wafer 30.

In the grinding process, the wafer 30 is required to be mounted to the wafer frame 34 with the front surface (circuit forming surface) facing downwardly so as to grind the back surface which is opposite to the front surface of the wafer 30. Accordingly, in order to directly recognize the dicing line by image recognition, the wafer 30 must be turned over between the grinding process and the dicing process so that the front surface of the wafer 30 can be seen. This increases a number of processes, and causes a problem in that the wafer 30 may be damaged during the handling process for turning over the wafer 30.

However, in the present embodiment, such a problem is eliminated by recognizing the dicing line (scribe line) from the back side of the wafer 30 by using an infrared beam. That is, when the infrared beam is projected onto the back surface of the wafer 30, the infrared beam transmits through the wafer 30 and is reflected by marks formed along the scribe line on the front surface since the marks are formed by aluminum. The reflected infrared beam transmits through the wafer 30 and returns to the back surface side. Thus, by detecting the reflected infrared beam by the infrared camera 40 positioned on the back surface side of the wafer 30, the scribe line can be recognized from the back surface side of the wafer 30. Accordingly, the wafer 30 is not required to be turned over between the grinding process and the dicing process. This eliminates the problem of damage or crack in the wafer 30, and the manufacturing process is simplified.

After the scribe line is recognized in the above-mentioned manner, the dicing saw 42 is driven and moved along the scribe line as shown in FIG. 11. Thereby, the wafer 30 is diced and divided into a plurality of semiconductor chips 30A. In the dicing process, a process referred to as a full-dicing is performed in which the wafer 30 is completely cut by the dicing saw 42.

After the above-mentioned dicing process (step S26) is completed, the chip removing process (step S28) is performed.

Figure 12:
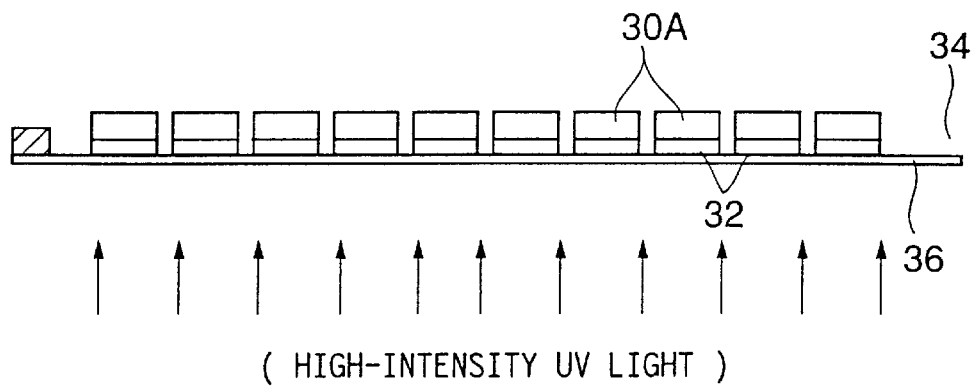
FIG. 12 is an illustration for explaining a chip removing process shown in FIG. 7.
Figure 13:
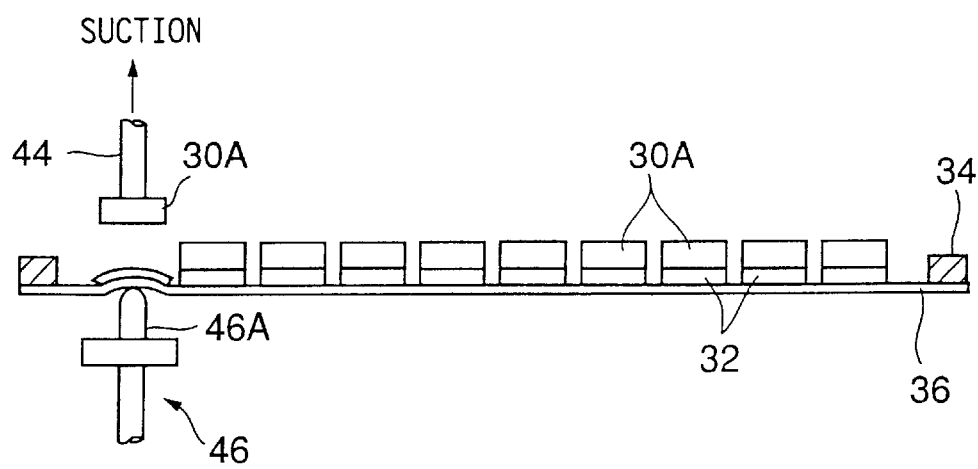
FIG. 13 is an illustration for explaining the chip removing process shown in FIG. 7.

FIG. 12 and FIG. 13 are illustrations for explaining the chip removing process. In the chip removing process (step S28), an ultraviolet beam (UV light) is projected onto the wafer 30 from a back side of the dicing tape 36 as shown in FIG. 12. In this embodiment, the pressure-sensitive adhesive applied to the protective tape 32 is an ultraviolet cure type. The UV light projected onto the wafer 30 is a high-intensity UV light (more than 200 mj/cm$^2$) which can cure the ultraviolet-cure pressure-sensitive adhesive applied to the protective tape 32 to adhere the protective tape 30 to the wafer 30. Accordingly, the ultraviolet cure pressure-sensitive adhesive is cured (hardened), which reduces an adhesive force (sticking force) between the protective tape 32 and the wafer 30 (each of the semiconductor chips 30A).

Thereafter, as shown in FIG. 13, each of the semiconductor chips 30A is pushed by using a pushing tool 46 while holding each of the semiconductor chips 30A by a vacuum pickup 44. The pushing tool 46 includes a pin (probe) 46A which is pressed against a back surface of the dicing tape 32. When the pin 46A is pressed against the back surface of the dicing tape 36 directly under one of the semiconductor chips 30A, the dicing tape 36 and the protective tape 32 directly under the one of the semiconductor chips 30A is locally bent, and a part of the one of the semiconductor chips 30A is separated from the protective tape 32. Then, the vacuum pickup 44 is moved upwardly so as to completely separate the one of the semiconductor chips 30A from the protective tape 32. Since the sticking force of the pressure-sensitive adhesive between the protective tape 32 and each of the semiconductor chips 30A (wafer 30) is weakened by the ultraviolet curing, the protective tape 32 remains stuck to the dicing tape 36. Accordingly, a process for removing the protective tape 32 from each of the semiconductor chips 30A is not needed. If the pressure-sensitive adhesive between the protective tape 32 and the wafer 30 is not the ultraviolet cure type, it is preferable that a sticking force of the pressure-sensitive adhesive between the protective tape 32 and the wafer 30 is smaller than a sticking force of the pressure-sensitive adhesive between the dicing tape 36 and the protective tape 32.

Each of the semiconductor chips 30A removed in the above-mentioned manner is conveyed to a chip storing container while being held by the vacuum pickup 44, and is stored in the chip storing container.

The present invention is not limited to the specifically disclosed embodiments, and variations and modifications may be made without departing from the scope of the present invention.

The present application is based on Japanese priority application No.11-115402 filed on Apr. 22, 1999, the entire contents of which are hereby incorporated by reference.

What is claimed is:

1. A method of manufacturing a semiconductor device including a wafer having a front surface on which circuits are formed and a back surface opposite to the front surface, comprising the steps of:

applying a protective tape to the front surface of said wafer;

mounting said wafer to a dicing tape via said protective tape, said dicing tape being spread on a wafer frame having a size larger than a diameter of said wafer;

grinding the back surface of said wafer while said wafer is mounted on said dicing tape; and dicing said wafer, after the step of grinding is completed, while said wafer is mounted on said dicing tape.

2. The method as claimed in claim 1, wherein said protective tape is applied to said wafer by ultraviolet-cure adhesive, and said manufacturing method further comprises the step of projecting an ultraviolet beam onto said ultraviolet-cure adhesive after completion of the step of dicing.

3. The method as claimed in claim 1, wherein the step of dicing includes the steps of:

projecting an infrared beam onto said wafer from a side of the back surface of said wafer so as to detect reflection of the infrared beam; and recognizing a scribe line based on the reflection of the infrared beam so that the dicing is performed by referring to the recognized scribe line.

4. The method as claimed in claim 1, wherein the step of grinding includes the step of fixing said wafer frame on a vacuum chuck table having a size larger than said wafer frame.

5. The method as claimed in claim 1, further comprising the step of removing said semiconductor device from said protective tape, after the step of dicing is completed, by pushing said semiconductor device via said dicing tape while holding said semiconductor device by a vacuum pickup tool.

6. The method as claimed in claim 1, wherein said semiconductor device is formed by full-dicing in the step of dicing.

7. The method as claimed in claim 2, wherein said ultraviolet-cure adhesive is ultraviolet-cure pressure-sensitive adhesive.

* * * * *